United States Patent [19]
Couch et al.

[11] Patent Number: 4,788,579
[45] Date of Patent: Nov. 29, 1988

[54] SEMICONDUCTOR SUPERLATTICE

[75] Inventors: Nigel R. Couch, Pinner Green; Michael J. Kelly, Hampstead, both of England

[73] Assignee: The General Electric Company, England

[21] Appl. No.: 906,925

[22] Filed: Sep. 15, 1986

[30] Foreign Application Priority Data

Sep. 30, 1985 [GB] United Kingdom ................ 8524070
Dec. 9, 1985 [GB] United Kingdom ................ 8530294

[51] Int. Cl.$^4$ .................... H01L 27/12; H01L 29/161; H01L 27/14
[52] U.S. Cl. .......................................... 357/4; 357/16; 357/30
[58] Field of Search ................ 357/4 SL, 4, 16, 30 E, 357/30 B, 30 P

[56] References Cited

U.S. PATENT DOCUMENTS

| 3,626,328 | 12/1971 | Esaki | 357/4 SL |
|---|---|---|---|
| 4,353,081 | 10/1982 | Allyn et al. | 357/16 |
| 4,383,269 | 5/1983 | Capasso | 357/16 |
| 4,439,782 | 3/1984 | Holonyak, Jr. | 357/4 SL |
| 4,450,463 | 5/1984 | Chin | 357/4 SL |
| 4,476,477 | 10/1984 | Capasso et al. | 357/16 |
| 4,590,507 | 5/1986 | Capasso et al. | 357/28 |
| 4,607,272 | 8/1986 | Osbourn | 357/4 SL |
| 4,620,206 | 10/1986 | Ohta et al. | 357/4 SL |
| 4,679,061 | 7/1987 | Capasso et al. | 357/30 E |

FOREIGN PATENT DOCUMENTS 0134069  3/1985  European Pat. Off. ............ 357/16

Primary Examiner—Martin H. Edlow
Assistant Examiner—Donald J. Featherstone
Attorney, Agent, or Firm—Kirschstein, Kirschstein, Ottinger & Israel

[57] ABSTRACT

A semiconductor device comprises two layers of semiconductor material each of different conductivity type, with a region of semiconductor material sandwiched between the layers. The material of which the region is formed is of the same composition as the first layer at the edge of the region adjacent to the first layer, and varies in composition linearly on the running average in the direction between the layers such that the region forms a heterojunction with the second layer.

5 Claims, 5 Drawing Sheets

SEMICONDUCTOR SUPERLATTICE

BACKGROUND OF THE INVENTION

This invention relates to semiconductor devices. In particular the invention relates to semiconductor devices of a diode form.

SUMMARY OF THE INVENTION

It is an object of the present invention to provide a semiconductor device of a diode form which displays novel electronic properties leading to tailorable current-voltage characteristics.

According to the present invention a semiconductor device comprises: first and second layers of semiconductor material each of different conductivity type; and a region of semiconductor material sandwiched between the first and second layers, the material of which the region is formed being of substantially the same composition as the first layer at the edge of the region adjacent to the first layer, and varying in composition linearly on the running average in the direction between the first and second layers, such that the region forms a heterojunction with the second layer.

In one particular device in accordance with the invention the region is formed of a material whose composition varies continuously along said direction.

In another particular device in accordance with the invention the region comprises a stack of alternating layers of two different semiconductor materials which together define a superlattice along said direction, the relative thicknesses of the alternating layers varying along said direction.

BRIEF DESCRIPTION OF THE DRAWINGS

Two diodes in accordance with the invention will now be described, by way of example only, with reference to the accompanying figures in which.

DETAILED DESCRIPTION OF THE PREFERRED EMBODIMENTS

Figure 1:
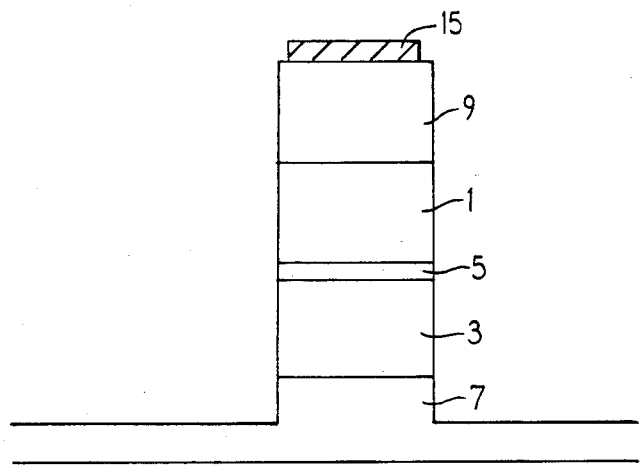
FIG. 1 is a schematic side view of the first diode.
Figure 2:
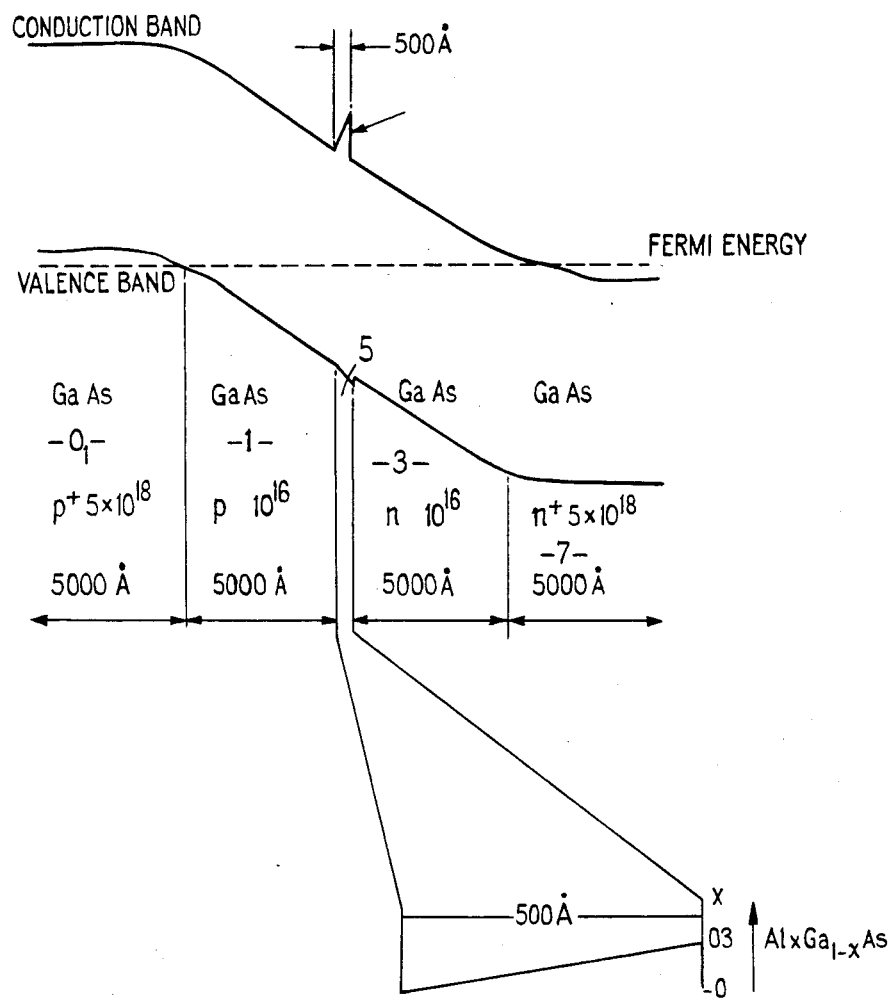
FIG. 2 illustrates the composition through the first diode, together with the corresponding energy bands.

Referring firstly to FIG. 1, the first diode comprises a 5000 Å thick layer of p doped GaAs 1 and a 5000 Å layer of n doped GaAs 3, a 500 Å thick layer of $Al_xGa_{1-x}As$ 5 being sandwiched between the layers 1, 3. As can be seen in FIG. 2, the Al content x of the layer 5 varies linearly from zero adjacent to the p type layer 1, to 0.3 adjacent to the n type layer 3, this being accompanied by a corresponding decrease in the Ga content of the layer. At either side of the layers 1, 3 there are provided respective $n^+$ doped GaAs 7 and $p^+$ doped GaAs 9 capping layers each 5000 Å thick, the $n^+$ layer lying on a $n^+$ doped GaAs substrate 11. Respective metal contacts 13, 15 for the device are provided on the free surface of the substrate 11 and the $p^+$ capping layer 9. The doping levels of the layers 1, 3, 7, 9 are as indicated in FIG. 2. The thickness of the layer of $Al_xGa_{1-x}$5 is chosen to be in the order of the electron mean free path, this layer 5 forming part of the depletion region of the device and producing a discontinuity in the conduction band edge as shown in FIG. 2.

Figure 3:
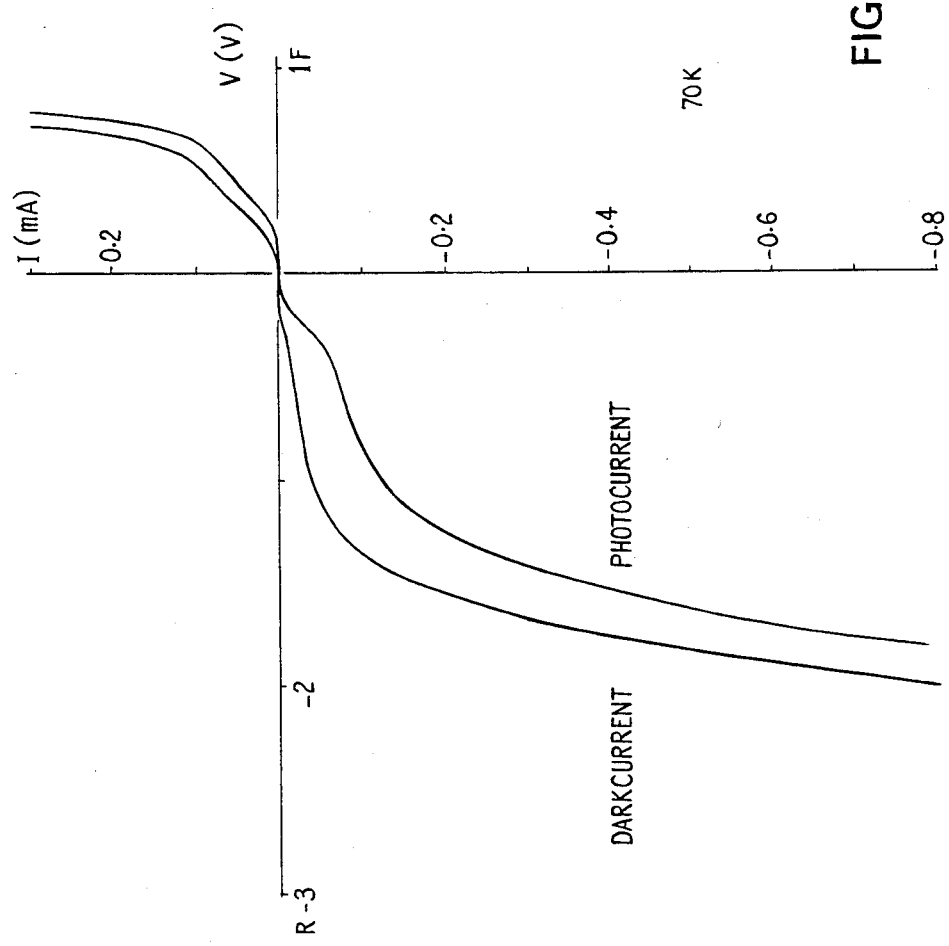
FIG. 3 shows the current-voltage characteristic of the first diode.

The current-voltage plot of the first diode measured at 70K is shown in FIG. 3, both the dark current, and the photocurrent produced when the diode is illuminated being shown. As can be seen the device exhibits a large photovoltaic effect. This indicates use of the device as a high performance photodetector, or as a solar cell.

Figure 4:
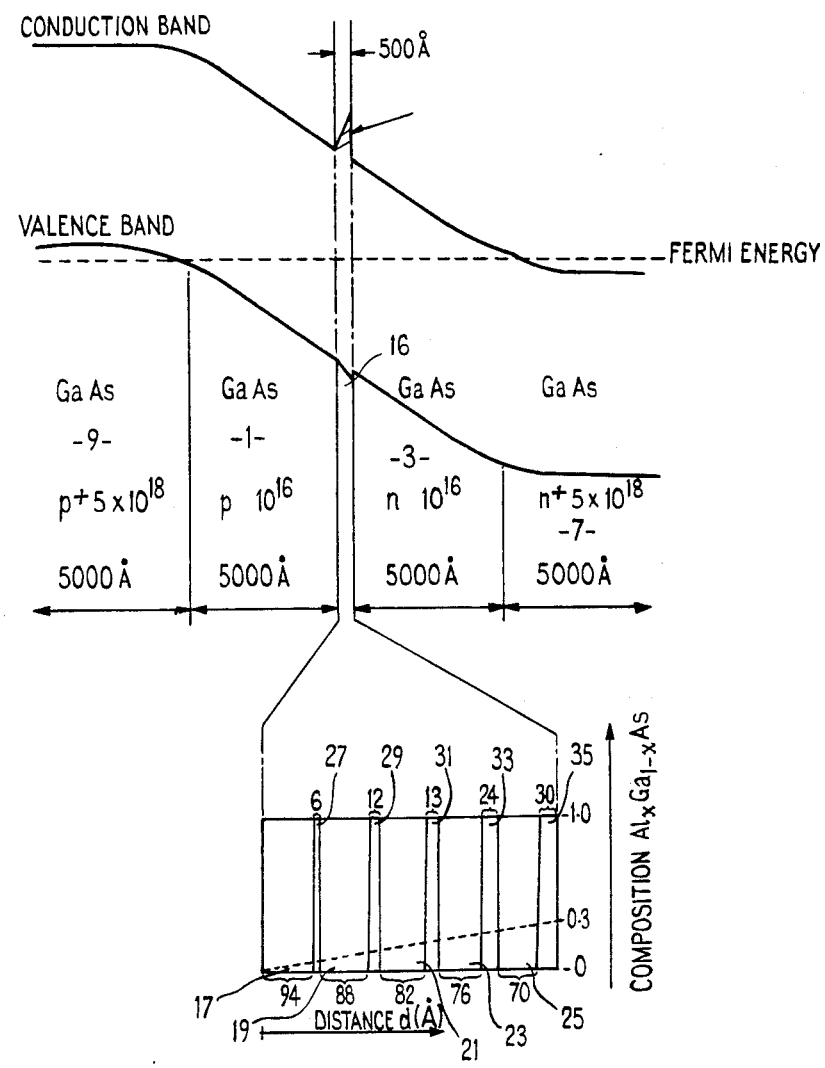
FIG. 4 illustrates the composition through the second diode, together with the corresponding energy bands.

Referring now to FIG. 4 the second diode to be described is of the same general form as the first diode and therefore corresponding parts of the second diode are correspondingly labelled. The layer of $Al_xGa_{1-x}As$ 5 is however replaced in the second diode by a stack 16 of alternating layers of GaAs 17, 19, 21, 23 and 25 and AlAs 27, 29, 31, 33 and 35, these layers constituting a compositional superlattice. The thickness of each of the GaAs layers decreases linearly along the direction from the p doped layer 1 to the n doped layer 3 from 94 Å to 70 Å, the thickness of each AlAs layer correspondingly increasing from 6 Å to 30 Å. The running average composition of the stack 16 in the direction between the layers 1, 3 is as shown in FIG. 4 by the dotted line, this in fact being equivalent to the linearly graded $Al_xGA_{1-x}As$ composition of the layer 5 of the first diode. The conduction band edge for the second diode is thus of similar form to that shown in FIG. 2 for the first diode.

Figure 5:
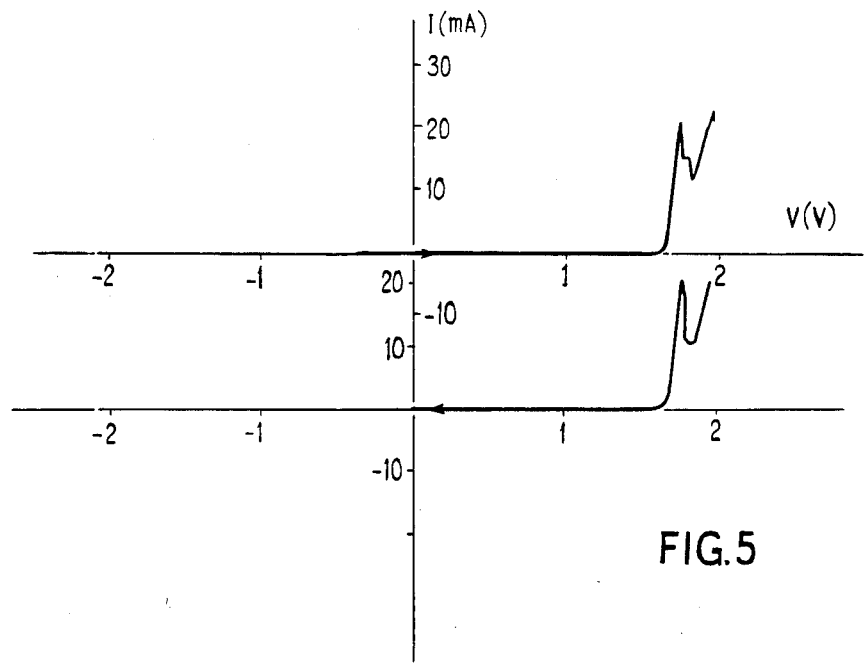
FIG. 5 shows the current-voltage characteristic of the second diode.

FIG. 5 illustrates the general form of the current voltage plot for the second diode where it can be seen the diode exhibits negative differential conductivity for applied voltages of about 1.7 volts. Thus such a diode finds application as a microwave local oscillator.

Figure 6:
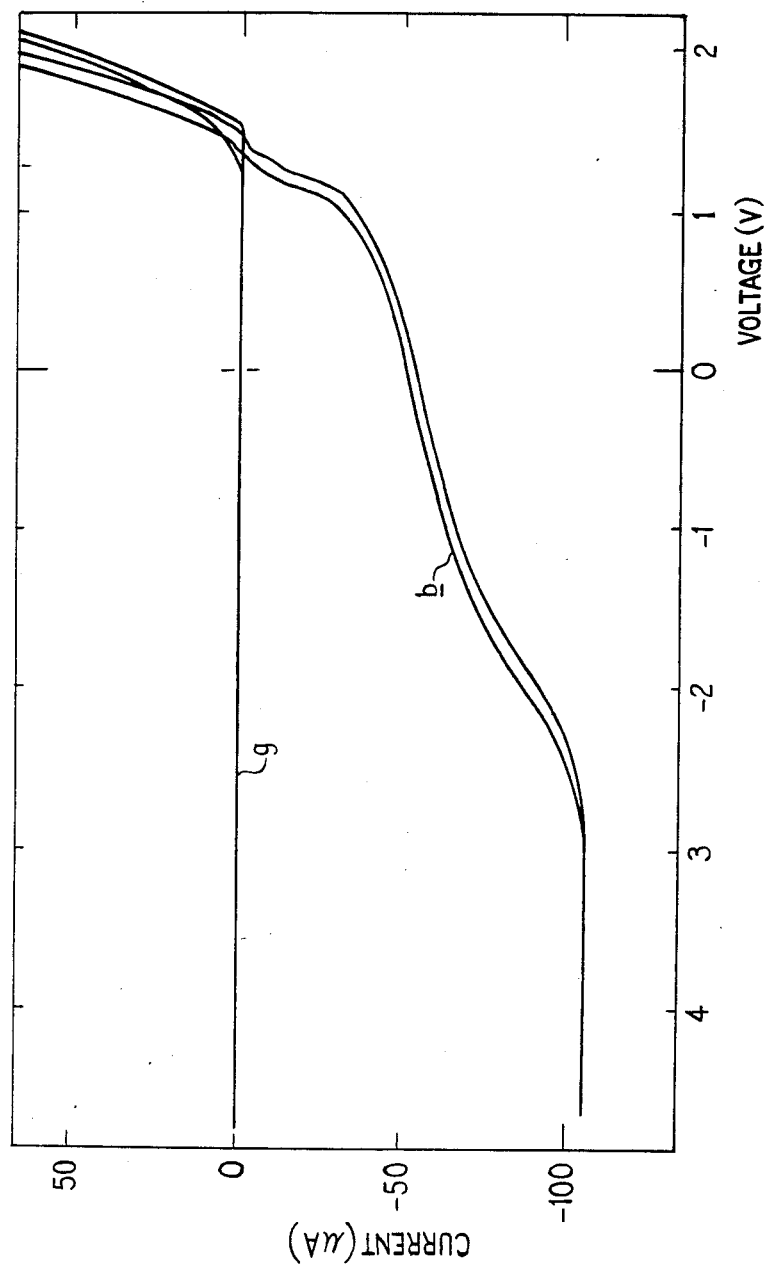
FIG. 6 shows the current-voltage characteristic of the second diode with an amplified current scale to that of FIG. 5.

Referring now also to the more detailed current voltage plot of FIG. 6, trace a illustrates the current voltage plot measured at 4K for the second diode with the device kept in the dark, whilst trace b illustrates the corresponding current voltage plot whilst the device is illuminated with a continuous wave HeNe laser. As can be seen from plot a, the dark current for the second device is less than 11 pA over the voltage range +1.1 v to −4.5 v with no discernable voltage dependence. For voltages of greater than 1.52 v, the current is controlled by the turn on of the p-n junction, constituted by the layers 1, 3 and resonant tunnelling through the barriers constituted by the layers 27, 29, 31, 33 and 35 of AlAs within the superlattice separating the p doped GaAs layer 1 and the n doped GaAs layer 3. Breakdown of the device in reverse bias is found to occur at −25 V. As can be seen from plot b of FIG. 6, under illumination the second diode exhibits a photovoltage and an associated photocurrent. In reverse bias, the photocurrent is found to saturate at −3.0 V at a current of 108 μA. The short circuit current is measured to be 85 μA, with the open circuit voltage being 0.94 v.

At room temperature similar current-voltage characteristics for the second diode are obtained, although a leakage current superimposed equally on both the dark and photo-currents is produced. The photocurrent is still found to saturate at −3.0 V at room temperature however, at a value of 85 μA.

The existence of the low dark current for the second diode thus indicates a number of opto-electronic applications for this second diode which utilise the large increase in sensitivity over that of conventional p-i-n diodes.

It will be appreciated that whilst the diodes described by way of example are based on the two materials GaAs and AlAs, diodes in accordance with the invention can be formed from any pair of compound semiconductors that are capable of mutual epitaxial growth. This includes the pairs of materials InGaAs/InP, InGaAsP/InP and HgCdTe/CdTe which have particular application in systems for optical communications and use in the infrared.

It will also be appreciated that whilst in the diodes described before by way of example particular layer thicknesses have been specified, these may be readily varied in accordance with the particular diode characteristics required. Generally the thickness of the layer of varying composition will be up to about ten times the electron mean free path for the materials used. For thin layers of varying composition, of a thickness in the order of 20 Å, tunnelling and interference effects will dominate the characteristics of the diode, these effects slowly dying off with increasing thickness.

It will also be appreciated that whilst in the diodes described before by way of example the particular doping levels specified in FIGS. 2 and 4 are used, these levels may also be readily varied in accordance with the required device characteristics.

We claim:

1. A semiconductor device, comprising: first and second regions of semiconductor materials of different conductivity types but having the same energy bandgap; and a stack sandwiched between said first and second regions and comprising pairs of layers of semiconductor materials which together define a superlattice in a direction from said first region to said second region each of said pairs of layers comprising a layer of a first semiconductor material and a layer of a second semiconductor material, the layers being arranged in said stack such that said first and second semiconductor material layers alternate within said stack; said layers of said first semiconductor material within said stack having respective thickness dimensions which vary from one of said regions to the other along said direction, and said layers of said second semiconductor material within said stack having respective thickness dimensions which vary from said one region to the other along said direction; and said material of that layer of said stack which is adjacent said first region being formed of substantially the same composition as said first region.

2. A device according to claim 1, in which successive layers of said first semiconductor material increase in thickness along said direction, and in which successive layers of said second semiconductor material decrease in thickness along said direction.

3. A device according to claim 2, in which each pair of layers has a combined thickness which is substantially the same as that of each other pair of layers.

4. A device accordng to claim 2, in which the first region is formed of p doped GaAs, the second region is formed of n doped GaAs, and the alternating layers are of GaAs and AlAs.

5. A device according to claim 1 in which the first region if formed of p doped GaAs, the second region is formed of n doped GaAs, and the alternating layers are of GaAs and AlAs.

* * * * *